Figure 1:
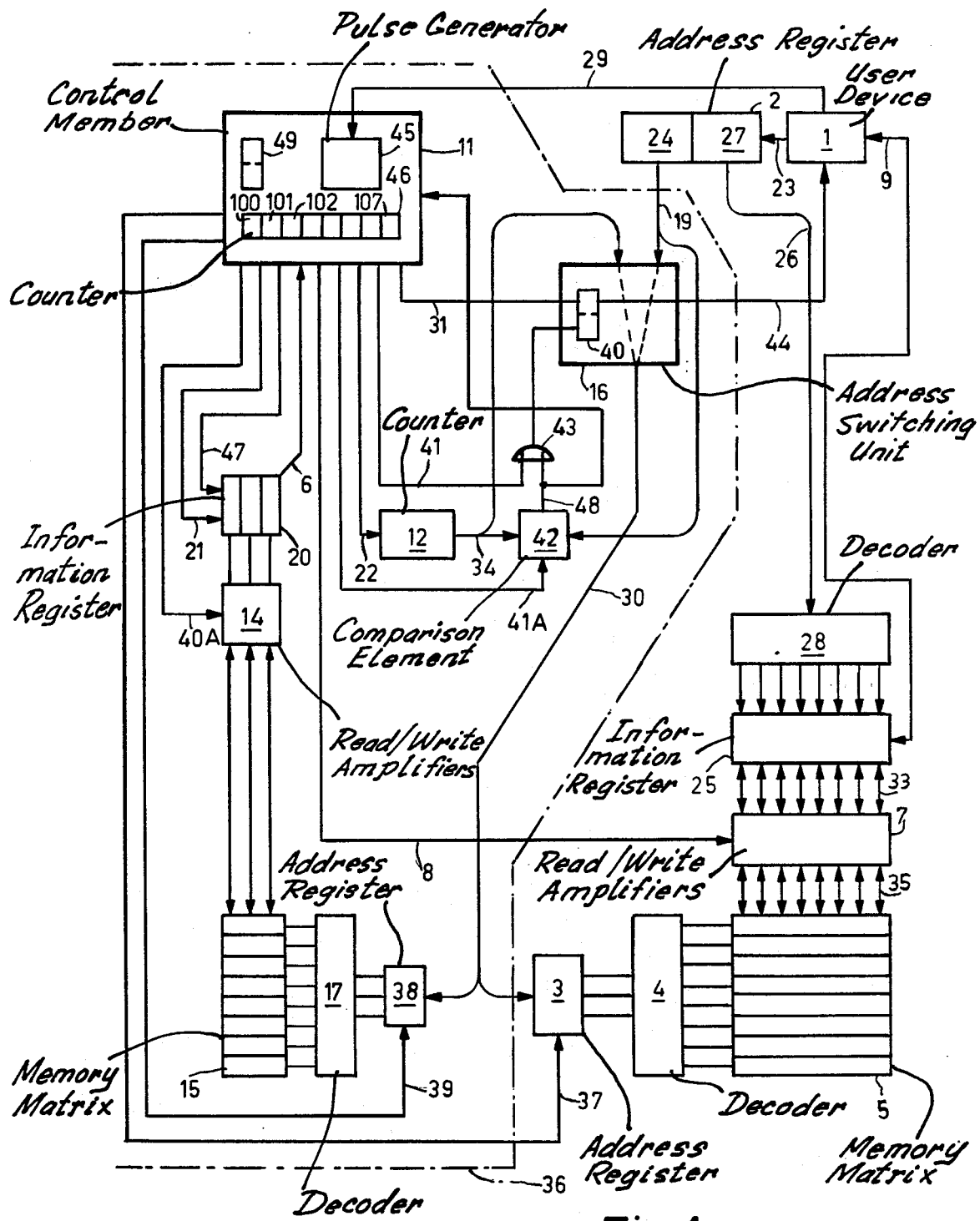

United States Patent [19]

Spoelder

[11] 4,112,514
[45] Sep. 5, 1978

[54] MEMORY WITH DYNAMIC INFORMATION STORAGE

[75] Inventor: Gerrit Adriaan Spoelder, Apeldoorn, Netherlands

[73] Assignee: U.S. Philips Corporation, New York, N.Y.

[21] Appl. No.: 759,746

[22] Filed: Jan. 17, 1977

[30] Foreign Application Priority Data

Jan. 22, 1976 [NL] Netherlands ......................... 7600648

[51] Int. Cl.² ............................................ G11C 11/40
[52] U.S. Cl. .................................... 365/222; 307/238
[58] Field of Search .................... 340/173 R, 173 DR; 307/238

[56] References Cited

U.S. PATENT DOCUMENTS 3,737,879  6/1973  Greene ......................... 340/173 DR Primary Examiner—Terrell W. Fears
Attorney, Agent, or Firm—Frank R. Trifari; Daniel R. McGlynn

[57] ABSTRACT

A refreshing organization for use in a main memory with dynamic information storage. In the case of a memory matrix, for example, each row of bit positions is addressed by first sub-address signals, with the result that a refreshing operation is performed for the complete information of the relevant row. Within a row, each bit position is addressed by second sub-address signals. A second memory is provided which includes one word position for each bit row of the main memory. The second memory has a comparatively short memory cycle. During the first half of the "slow" memory cycle, a word of the second memory is addressed by the first sub-address signals and is filled with predetermined information. During the second half of the "slow" memory cycle, a next word of the second memory is addressed during each cycle by the position of an address counter. The stored word which is addressed is then read. The output register is constructed as a counter; the information read is increased by 1 and is written back. A carry output signal of the output register can reserve the next "slow" cycle of the main memory for the execution of a refreshing operation at an address of the main memory which corresponds to the position of the address counter.

2 Claims, 2 Drawing Figures

| | | | | | |
|---|---|---|---|---|---|
| 100 | 37 AD | 39 AD | | | |
| 101 | 8 RE | 40 RE | | | |
| 102 | | 21 RS | | | |
| 103 | | 40 WR | 31 SLF | (49) RLS | 22 CO |
| 104 | 8 WR | 39 AD | | | |
| 105 | | 40ARE | | | |
| 106 | | 47 CO | | 6 CRR→(49) BLO | |
| 107 | | 40AWR | 41 USR | 41 A COM | |

Fig. 2

MEMORY WITH DYNAMIC INFORMATION STORAGE

The invention relates to a memory device, comprising a first memory for volatile (dynamic) information storage, with a first connection for receiving first partial address signals from a user device for a memory section, with a second connection for receiving second partial address signals from the user device for a fraction of the memory section addressed by the first partial address signals, an information transport line for transporting information signals between the user device and the said fraction addressed by the first and the second partial address signals. The first partial address signals control a refreshing operation for the memory section, the first memory comprising a sequence of memory sections which can all be selectively addressed by predetermined first partial address signals. The memory device furthermore comprises a clock-driver control device for controlling a refresh addressing operation of a memory section prior to the expiration of a reliability period after the most recent reception of the first partial address signals for the relevant memory section.

In such a memory device the information storage may be, for example, in the form of charges or capacitors which have a finite leakage resistance, and the information must be refreshed within its reliability period. One method of doing this is known from U.S. Pat. No. 3,760,379.

The present invention provides a memory device comprising an input for a composite address signal made up from first and second partial address signals, a first memory for volatile information storage individual sections of which are selectively addressable by applying individual said first partial address signals to said first memory and individual fractions of said sections are selectively addressable by applying individual said second partial address signals to said first memory. The device input is coupled to said first memory. The first memory is constructed to refresh within a given time the information in any said section in response to addressing thereof a second memory having a word location corresponding to each said section. Each word location in the second memory is individually addressable by applying the first partial address signal by which the corresponding section of the first memory is addressable to said second memory, an address counter for generating successive address signals which correspond to the first partial address signals by which the word locations in the second memory are addressable. A data register is constructed to produce a signal on an output thereof when the contents thereof reach a predetermined value. A control device causes, in a first state thereof, any first partial address signal present at said input to be applied to the second memory. Predetermined information indicative of the subsequent reliability period of the information in the section of the first memory addressed by said first partial address signal is written, within a time which is substantially shorter than said given time, into the word location of the second memory thus addressed, and causes, in a second state thereof, the output of the address counter to be applied to the second memory. The information in the word location of the second memory thus addressed is written into the data register, incremented, and written back into the same word location of the second memory within a time which is also substantially shorter than said given time. The address register is incremented each time before its contents are so used to address the second memory. The control device has a clock input, constructed to cycle between said first and second states when clock signals are applied to said clock input. Means are included for causing the contents of said address register to be applied to the first memory in lieu of any first partial address signal present at said memory device input if a signal should appear at the output of the data register when the control device is in its second state and the contents of the address register should not correspond with the first partial address signal present and for causing the return to the first state to be delayed until after said contents have been so applied, so that the information in each section of the first memory will always be refreshed within its reliability period.

The first memory may contain, for example, 4K (4096) words of 16 bits each and be bit-organized. It may then be made up, for example, from 16 integrated memory chips the address inputs of which are connected in parallel and which each comprise 64 rows of 64 bit positions. Each said group of word locations may then comprise those rows of bit positions in all 16 memory chips which have the same first partial addresses; each group with then contain 16 rows of 64 bit positions (= 1024 bit positions) and each word location will be made up from corresponding bit locations in all 16 rows, which word location can be addressed by simultaneously addressing corresponding rows in all 16 chips and corresponding columns in all 16 chips. A refreshing operation will then take place for the 1024 bit positions in the addressed rows.

The second memory may have a cycle time which is, for example, half that of the first memory. It may also be constructed for volatile information storage; this need not be a disadvantage because the address counter continuously cycles through all address positions in operation. It has been found in practice that the use of the address signals from the address register in lieu of those at the device input may occur only rarely.

Preferably, a comparison element is provided for comparing the contents of the address register with any first partial address signal present at the input of the device and blocking the output of the data register if correspondence should occur. This can give faster operation and hence greater availability.

An embodiment of the invention will be described in detail hereinafter, by way of example, with reference to the accompanying diagrammatic drawing, in which FIG. 1 is a block diagram of the embodiment, and FIG. 2 lists the sequences of various occurrences in the device of FIG. 1.

In FIG. 1 a memory device comprises an address register 2 which comprises sections 24 and 27, an address register 3, two decoders 4, 28, a memory matrix 5, read/write amplifiers 7, an information register 25, a control member 11 including a pulse generator 45 which feeds a control counter 46 having positions 100–107, a counter 12, an address register 38, a decoder 17, a memory matrix 15, and read/write amplifiers 14. The device further comprises an information register 20 is constructed as a counter, a comparison element 42, a logic OR-gate 43, an address switching unit 16 including a flipflop 40, and a further flipflop 49 in the control member 11. A number of lines for transporting information signals, address signals and control signals are also provided. A portion 36 of the device constitutes a control device having first and second states, for ensuring that locations in memory 5 are refreshed at intervals so that the reliability period of the information therein is not exceeded.

Central control is effected by a user device 1 which may be, for example, a central processor (CPU) of a computer or a unit forming a connection with such a machine. The control member 11 produces pulses for controlling the various other elements of the memory device and is synchronized, for example, from the central clock of the user device 1 by a regular train of start clock pulses which occur, for example, one for each cycle of memory 5, which pulses are carried on the line 29. Member 11 produces signals on its various outputs in response to each input clock pulse, and inter alia cycles memory 5 in response thereto (although of course memory 5 could alternatively be cycled by means of internally generated signals, each cycle being started by a command received directly from device 1). When the device 1 requests access to the memory 5, it generates address signals and read/write control signals on the line 23 which signals are stored temporarily in the address register 2 although alternatively they could be sent directly to control member 11. The memory 5 is assumed for the purposes of the following explanation to be bit organized and to comprise 8 × 8 = 64 words of one bit each; therefore the addresses consist of six bits. The three most significant address bits are supplied from the register section 24 to the address switching unit 16 via the line 19. Conduction in this unit is under the control of the state of the flipflop 40, and when conduction occurs from line 19 to line 30 these address bits are applied, via the line 30, to the address register 3 which stores them under the control of a signal on the line 37. A row of bit positions in the memory 5 is addressed by these three address bits, (after decoding in decoder 4); thus these three bits form binary first partial address signals. The address switching unit 16 also has a second input 34 for another three address bits and conducts only one of the two groups of three address bits received, which group depending on the state of flipflops 40. (A selector switch is provided in unit 16 for each address bit.) The address in the register 3 is decoded into a 1-out-of-8 code by the decoder 4. The line 8 from the control member 11 carries a read command signal during the first part of each memory cycle initiated in the memory 5, corresponding activating the read/write amplifiers 7. When this occurs, eight information bits appear on the inputs 33 of the information register 25. Meanwhile, the three least significant address bits ("binary second partial address signals") are supplied from the section 27 of the register 2, via the line 26, to the decoder 28 which decodes them into a 1-out-of-8 code. This code activates the output of only one of the eight elements of the information register 25, so that only a single information bit from register 25 can reach the device 1 via the line 9. If this information bit is required by device 1, i.e. if a read operation is required, input amplifier which is included in the device 1 and which is connected to the line 9 is activated. If on the other hand a write operation is required, an output amplifier included in the device 1 and connected to the line 9 is activated during the second half of the corresponding memory cycle of the memory 5, with the result that new information is introduced into the element of the information register 25 which is still addressed. The line 8 from the control member 11 carries a write command signal during the second part of each memory cycle of the memory 5, causing the read/write amplifiers 7 to again be correspondingly activated; under the control thereof the eight information bits (including one which is "new" if a write operation is being carried out) in the information register 25 are written back into the row of bit positions in the memory 5 still addressed by the address register 3.

In practice the line 8 may be of a multiple construction, enabling the control signals for reading and writing to be transported via different conductors thereof. The lines 9, 33, 35 are, it will be noted active in two directions.

Because storage in register 25 is in the form of elements of register 25 corresponding to each bit attaining one of two possible states, and/or because activation of amplifier 7 results in elements thereof corresponding to each bit attaining one of two possible states, the information in the complete row of bit positions addressed in memory 5 is refreshed by the read/write cycle set forth; the analog quantity (for example, a charge on a capacitor) stored at a bit position in memory 5, whose value represents digital information and tends to decay with time, is restored to within the tolerance limits defining the relevant digital values. It will be noted that this refreshing action occurs whether or not the information in the addressed bit positions is transported to or from the user device 1. However, reliable reading out of the information can be effected only for the duration of a reliability period of, for example, 2 ms, during which period the decay of the charge is still sufficiently small to allow device 7 and/or register 25 to restore the standard tolerances. If readout occurs after the expiry of this period after a previous refresh operation on the relevant locations the information from memory 5 may be treated incorrectly by amplifier 7 and/or register 25, the likelihood of this happening increasing with time. If it does happen the information stored will be mutilated beyond repair: a "1" signal, for example, may be interpreted as a "0" and refreshed to that value.

Therefore the memory device shown in FIG. 1 also includes the further components of the control device 36 in order to refresh each memory section (in the present case one row of bit positions) if it should not be otherwise addressed during the reliability period after it was previously addressed (and consequently refreshed). To this end the control member 11, in addition to producing signals on the output (outputs) 8 to control reading and writing in the memory 5 during each memory cycle thereof, also produces other signals during each memory cycle. One of these, generated on the control line 31, causes the flipflop 40 to make the address switching unit 16 conduct the first partial address signals from the line 19, via the line 30, to the address register 3 during the first half of a memory cycle of the memory 5 (as has already been described), and also, to the address register 38 in which they are stored under the control of a signal also produced by member 11 on the control line 39. The address stored in address register 38 is decoded into a 1-out-of-8 code by the decoder 17, so that a corresponding plural-bit word position in the memory 15 is also addressed. The information bits read from 15 are applied to the information register 20 by the read/write amplifiers 14 under the control of a signal produced by control member 11 on the line 40A (which may be of a multiple construction similarly to the line 8). The content of the information register (counter) 20 is then set to zero under the control of a signal produced by the control member 11 on the line 21, and this zero information is then written, under the control of a further signal on the line 40A, into the word position of the memory 15 which is still addressed by the address register 38 as an indication that the corresponding section of the memory 5 (the section having the same first partial address) has just been read. Of course a number other than zero may alternatively be used as such an indication. The duration of the read-/write memory cycle of the memory 15 is substantially shorter, for example half, that of the memory 5 and in consequence the memory 15 will be comparatively expensive and/or it will dissipate substantial energy. However, it has a comparatively small capacity, which fact can alleviate the higher costs and/or dissipation.

With the relative memory cycle durations specified there is enough time for a second memory cycle of the memory 15 within each memory cycle of the memory 5 and, after completion of the first memory cycle of the memory 15 within each memory cycle of the memory 5, the control member 11 applies a signal to the address switching unit 16 via the line 31, within the same cycle, setting the flip-flop 40 to the state which causes the address switching unit 16 to conduct the three-bit address signal on the line 34 to the line 30 (from which state the said flip-flop can be reset via the OR-gate 43 by a signal on the line 41 or 48). The address bits on the line 34 are supplied by the three-bit binary counter 12 which thus acts as an alternative address register. The address bits conducted by unit 16 are stored in the address register 38 under the control of a signal on the line 39 in the manner previously described. The line 37 does not now carry a signal, so that the (slower) memory cycle of the memory 5 can be completed without obstruction. Under the control of the information in the address register 38, the decoder 17 and a signal applied by the control member 11 to the read/write amplifiers 14 via line 40A, another word position in the memory 15 is read and the resulting information is stored in the information register 20. A signal now produced on the line 47 by the control member 11 causes the information in the register 20 to be increased by one unit, this being possible because the register is constructed as a counter, and the incremented information is written back into the word position of the memory 15 which is still addressed by the information in the address register 38, this being again effected under the control of a signal on the line 40A. A second memory cycle of the memory 15 is thus completed within said given memory cycle of the memory 5. Provided that the count in register 20 did not reach a predetermined value when it was incremented the flipflop 40 is then reset (via the OR-gate 43) by a control signal produced on the line 41 by member 11, so that the address switching unit 16 can again conduct information from the register section 24.

Because counter 12 is incremented by a signal on line 22 during each cycle of memory 5, the various word locations in memory 15 are successively and repetitively addressed during successive second cycles of memory 15, so that the information in the various word positions of the memory 15 is an indication of the time which has expired since the last refreshing operation in the section of the memory 5 which has the same first partial address as the relevant word position in the memory 15.

An output signal is generated on the line 6 by the counter 20 when incrementing said counter causes said counter to reach a predetermined counting position. This position may be, for example, one more than the maximum count, in which case the signal on the line 6 will be a carry signal and the count remaining in the counter will be zero. The appearance of an output signal on the line 6 indicates that the reliability period of the information in that part of memory 5 having the corresponding first partial address is shortly to be exceeded. Said output signal is applied to the control element 11 and used to temporarily prevent the next addressing operation required by the user device 1, for example by causing the signal on the line 6 to set a flip-flop 49 in the control member 11 which then blocks the reset signal for the flipflop 40 in the address switching unit 16 which would otherwise appear on the line 41 at the end of the relevant second cycle of memory 15. If this occurs flipflop 49 is set to the unblocking position again during the next cycle of memory 5, as will be described below. The next memory cycle of the memory 5 will then take place using the first partial address given by the three address bits on the line 34, but otherwise exactly in the manner previous described, so that the information in the corresponding part of memory 5 is refreshed. A second memory cycle of the memory 15 again also takes place within this next cycle of the memory 5. The position of the flipflop 40 is signalled to the user device 1 via the line 44 as a "waiting" signal. The waiting situation may last for one or more memory cycles of the memory 5, because each new actuation of the line 47 can result in the generation of an output signal on the line 6. However, the probability that this will occur many times in succession can be made small. In any case the user device 1 will not always request access to the memory 5 during a cycle thereof, and then there will be no waiting situation.

Any three-bit partial address in the register section 24 is also compared after its arrical with the partial address on the line 34. If there should be correspondence, the flipflop 40 is reset via the line 48 and the OR-gate 43, so that the user device 1 is granted access even if an output has occurred on line 6 during the preceding memory cycle. The signal on line 48 may also be used directly by element 11 to initiate an "unblocked" cycle. Activation of the comparison device 42 is effected by a signal on the line 41A. This signal is simultaneous with that on the line 41 (if present), but it is not subject to the blocking process to which the signal on line 41 is subject. In the case of correspondence between the partial addresses in 24 and 12, the flipflop 40 is therefore reset without delay and no waiting situation will arise in the user device 1. In such a situation it is of course not essential to change over the transmission paths in address switching unit 16, as the partial addresses on lines 19, 34 will then be the same.

The partial addresses on the line 34 result from the position of the three-bit counter 12. As mentioned previously the counter position is incremented during each cycle of memory 5, in fact by a signal which coincides with that on the line 31, i.e. which occurs after each first memory cycle in memory 15 i.e. in the middle of each memory cycle of the memory 5. This timing offers the advantage that the next word position of the memory 15 is always read in the second half of a memory cycle of the memory 5 and that counter 12 always contains the address to be refreshed at the beginning of the next cycle of memory 5, if required.

As mentioned previously the information written back into a word-position of the memory 15 when an output signal is produced by the counter 20 and during a first cycle of memory 15 may be other than zero. If this is the case, this other information can be permanently stored in an additional register (not shown), and it may, if desired, be modified in the presence, for example, of strong noise signals or as a function of temperature, which external influences may affect the reliability period. Such an additional register can be filled, for example, via the address register 2, the address switching unit 16 and an additional line (not shown) under the control of an additional control signal from the user device 1. Obviously the higher the number so introduced into the counter 20 and hence into the memory 15, the earlier the counter 20 will produce an output signal, and the smaller the reliability period allowed will be.

In practice the memory 5 will normally be larger than that quoted. For example it may comprise several memory units connected in series and/or in parallel each containing, for example, 64 rows of 64 bit positions. 16 such units will make-up a 64 Kbit memory.

If the memory 5 is a 64 K bit memory having a cycle time of, for example, 1 μs, and a reliability period of, for example, more than 2 ms, the counter 12 may have 64 positions and the counter 20 may have 32 positions. The entire memory 5 will then be refreshed in 64 × 32 μs = 2.05 ms (even if no requests arrive from the user device), so that the reliability period will not be exceeded. If, on the other hand, the refreshing operation itself requires 64 μs, counter 20 may have five positions and counter 12 may have six. The lines 19 and 26 may carry six bits each when counter 12 is a 64 position one, and three bits and nine bits respectively when counter 12 is a six-position one. The register 2 may contain further bits up to a total length of 16 bits.

When counter 12 has 64 positions the lines 19 and 30 together carry 12 bits; in addition the control device 36 receives the start signals on the line(s) 29 and possibly other signals, for example, further control signals, which can also be conducted along the line(s) 29. The control device 36 also has output lines 37, 8 and 44, which carry a total of 3 to 4 bits. If the device 36 is constructed as an integrated circuit, a power supply line and an earth line are also required, so in total 12 + (2 to 3) +(3 to 4) + 2 = 19 to 21 connection lines may be required. Commonly used integrated circuit envelopes have 22 to 24 output pins so the necessary connection lines can be readily accommodated.

FIG. 2 lists the sequence of various occurrences in the device of FIG. 1. As mentioned previously the line 29 carries one starting pulse per memory cycle of the memory 5. In response thereto the pulse generator 45 in control member 11 produces 8 pulses distributed over each such cycle, each of which activates the next stage of the control (ring) counter 46 (the first column in FIG. 2), so that a control signal appears on the corresponding output thereof. Depending on its state the flipflop 49 can block one of these signals (that on line 41) in the manner described. Activation of the stage 100 of the counter 46 produces signals on the lines 37 and 39, which signals cause the first partial addresses to be stored in the registers 3 and 38. Activation of the stage 101 produces signals on the lines 8 and 40A, which signals activates the read/write amplifiers in their read mode. Activation of the stage 102 produces a signal on the line 21, which signal resets the counter 20 to zero (or the preset value). Activation of the stage 103 produces signals on lines 40A, 31 and 22. The signal on the line 40A activates the read/write amplifier 14 in its write mode, the signal on the line 31 changes over the flipflop 40, so that the input 34 of the address switching unit 16 is connected to its output 30 if it is not already so connected, and the signal on the line 22 increments the count of the counter 12. Activation of stage 103 also sets the flipflop 49 to its non-blocking state if it is at present in the blocking state. Activation of the stage 104 produces signals on lines 8 and 39. The signal on the line 8 activates amplifier 7 in its write mode in order to write the information contained in the register 25 back into the memory 5, and the signal on line 39 causes the address register 38 to be filled with a quantity corresponding to the position of the counter 12. (In certain cases the activation of line 8 at this instant may be superfluous if memory 5 is self-controlled to a certain extent, its initial activation by stage 101 then being sufficient). Activation of the stage 105 produces a signal on the line 40A which activates the read/write amplifier 14 in its read mode. Activation of the stage 106 produces a signal on the line 47 which increases the count in the counter 20 by one. If a carry output signal occurs on line 6 in consequence the flipflop 49 is set to the blocking position. Activation of the stage 107 produces signals on lines 40A and 41A. The signal on the line 40A activates the read/write amplifier 14 in its write mode, so that the increased count in the register 20 is written back into the memory 15. Activation of stage 107 moreover produces a signal on the line 41, provided it is not blocked by the position of the flipflop 49, in order to change over the flip-flop 40 so that the partial-address in section 24 of the register 2 can be conducted to line 30. The signal on the line 41A activates the comparison device 42 and if a signal appears in consequence on its output 48 the flip-flop 40 will be changed over even if the signal on line 41 is blocked. It should be noted that the various signals produced by member 11 may not necessarily be in the form of pulses; FIG. 2 merely illustrates the order in which the various signals appear rather than the various waveforms and their tolerances. The various signals have been grouped into columns in FIG. 2, the second column containing the control signals for the memory 5, the third column containing the control signals for the memory 15 and the register 20, and the other columns containing the other control signals. The numbers in the second and subsequent columns of FIG. 2 correspond to the various control lines and flip-flops and the letter combinations have the following significance:

AD : load address
RE : read
WR : write
RS : reset
CO : count by one
SLF : self
USR : user
COM : compare
BLO : block
RLS : release In the simple example quoted first with reference to FIG. 1 each of the lines 19 and 26 transports three bit signals, whilst the lines 8 and 9 transport one bit signal each. If the memory comprises more than one information bit per word, the elements 5, 7, 9 and 25 may be duplicated one or more times. However, it will be noted that the elements 2, 16, 3, 4 and 28 will not require duplication in such a case. The memory matrix 5 may of course have a different configuration, for example it may comprise 64 × 64 or 64 × 16 bit positions. In the former case, 6 + 6 = 12 address bits will be required. The memory 5 may be word-organized, a number of words being read at any time and only one read word being applied to the user device 1. It should also be noted that the sub-division of the register 2 into the sections 24 and 27 does not affect the user device 1; this device does not discriminate between primary selection (section 24) and secondary selection (section 27). Furthermore, if the memory is bit-organized more than one word may be simultaneously addressed by the address in the register 2 (the information thereof then being refreshed). If this is the case the connection 9 to and from the user device 1 may then be via a bi-directional change-over element which is similar to the switching unit 16, and which allows only one of the information words then arriving on the relevant input thereof to pass. Such a unit may be controlled by one or more additional address bits which may also be stored in the address register 2. It is of course possible for read/write control bits stored in the address register 2 to control conduction in the line 9 in one or both directions.

What is claimed is:

1. A memory system for operation with a user device, comprising:
    a first memory comprising memory sections for information storage, and having a first memory cycle time;
    a first address line connected to said first memory for receiving first partial address signals from said user device for addressing a memory section thereof, and controlling a refresh operation therein;
    a second address line connected to said first memory for receiving second partial address signals from said user device for addressing a portion of said memory section addressed by said first partial address signals,
    an information transport line connected to said first memory for transporting information signals between said user device and said memory section portion addressed by said first and second partial address signals;
    a second memory having a second memory cycle time substantially shorter than said first memory cycle time and having a plurality of memory positions each corresponding to a predetermined one of said memory sections;
    a third address line connected to said second memory for receiving said first partial address signals in parallel with said first address line,
    a data register having an input for receiving an incrementation signal and an output;
    control means having a first state and a second state, including an address-counter for said second memory, and a clock for cycling said control means between said states,
    said control means in said first state being operative for transmitting said first partial address signals to said second memory and for writing predetermined information into a memory position thus addressed,
    said control means in said second state being operative for transmitting the contents of said address counter after an incrementation thereof to said second memory for controlling a read-write cycle for the memory position thus addressed under further generation of an incrementation signal for writing back an incremented information,
    an output signal of said data register blocking the next subsequent transition to said first state, whereby said first memory thereupon is addressed by the contents of said address counter in lieu of by said first partial address signals, a memory section thus addressed being refreshed at least once within its reliability period.

2. A memory system as claimed in claim 1, further comprising comparison means connected to said address counter for receiving the position of the address counter and the first sub-address signals from the user device, a correspondence signal therein causing the conduction of the first sub-address signals then received from the user device.

* * * * *